(12) United States Patent
Kang et al.

(10) Patent No.: US 10,811,630 B2
(45) Date of Patent: Oct. 20, 2020

(54) DISPLAY DEVICE

(71) Applicant: Samsung Display Co., Ltd., Yongin-Si, Gyeonggi-Do (KR)

(72) Inventors: Seungjae Kang, Asan-si (KR); Ilhyun Yang, Cheonan-si (KR); Bongchun Park, Incheon (KR); Hyunseop Song, Bucheon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/536,392

(22) Filed: Aug. 9, 2019

(65) Prior Publication Data

US 2020/0058893 A1 Feb. 20, 2020

(30) Foreign Application Priority Data

Aug. 14, 2018 (KR) .................. 10-2018-0094715

(51) Int. Cl.
*H01L 51/52* (2006.01)
*H01L 27/32* (2006.01)
*H01L 51/50* (2006.01)

(52) U.S. Cl.
CPC ........ *H01L 51/525* (2013.01); *H01L 27/3248* (2013.01); *H01L 27/3262* (2013.01); *H01L 51/5044* (2013.01)

(58) Field of Classification Search
CPC .............. H01L 51/525; H01L 27/3262; H01L 27/3248; H01L 51/5044; H01L 51/5246; H01L 51/5284; H01L 27/322; H01L 27/3244; G09F 9/30
See application file for complete search history.

(56) References Cited

U.S. PATENT DOCUMENTS

| 9,978,674 B2 | 5/2018 | Kim et al. | |
| 2014/0049449 A1* | 2/2014 | Park | G09G 5/00 345/1.3 |
| 2014/0354612 A1* | 12/2014 | Okamoto | G02F 1/13452 345/204 |
| 2015/0155511 A1* | 6/2015 | Ohsawa | H01L 51/5028 257/40 |

(Continued)

FOREIGN PATENT DOCUMENTS

| KR | 1020170049747 A | 5/2017 |
| KR | 1020170114906 A | 10/2017 |
| KR | 1020170116844 A | 10/2017 |

*Primary Examiner* — Victor A Mandala
(74) *Attorney, Agent, or Firm* — Cantor Colburn LLP

(57) ABSTRACT

A display device includes a first display substrate including a display area and a non-display area, a second display substrate facing the first display substrate and including an end portion corresponding to the non-display area and extending along a first direction; a connection circuit board connected to the first display substrate at the non-display area thereof and disposed adjacent to the end portion of the second display substrate; and a first spacer and a second spacer each on the end portion of the second display substrate, and spaced apart from each other along the first direction to define a space therebetween. Along a second direction which crosses the first direction, a central portion of the connection circuit board connected to the first display substrate faces the space between the first spacer and the second spacer on the second display substrate.

20 Claims, 12 Drawing Sheets

(56) References Cited

U.S. PATENT DOCUMENTS

| | | | |
|---|---|---|---|
| 2016/0168432 A1* | 6/2016 | You | C09J 133/08 |
| | | | 359/893 |
| 2017/0154947 A1* | 6/2017 | Nakamura | H01L 51/5275 |
| 2017/0222156 A1* | 8/2017 | Kawakami | H01L 51/006 |
| 2018/0081240 A1 | 3/2018 | Kim et al. | |
| 2018/0081399 A1* | 3/2018 | Kwon | H01L 51/0097 |
| 2018/0143482 A1* | 5/2018 | Jin | G09G 3/30 |
| 2018/0294427 A1* | 10/2018 | Lee | H01L 51/5243 |
| 2019/0258295 A1* | 8/2019 | Fujimoto | G09F 9/00 |
| 2019/0293999 A1* | 9/2019 | Yasui | G02F 1/1347 |

* cited by examiner

DISPLAY DEVICE

This application claims priority to Korean Patent Application No. 10-2018-0094715, filed on Aug. 14, 2018, and all the benefits accruing therefrom under 35 U.S.C. § 119, the entire contents of which are hereby incorporated by reference.

BACKGROUND

(1) Field

The present disclosure herein relates to a display device, and more particularly, to a display device connecting a circuit board to a display panel through a tape automated bonding ("TAB") mounting method.

(2) Description of the Related Art

In general, a display panel of a display device is manufactured, and then a circuit board of the display device is connected to the display panel. For example, a tape automated bonding ("TAB") mounting method bonds the circuit board to the display panel by using an anisotropic conductive film ("ACF").

SUMMARY

The present disclosure provides a display device capable of reducing or effectively preventing a circuit board from being damaged from moisture incident to a display surface of the display device.

An embodiment of the invention provides a display device including: a first display substrate including a display area and a non-display area which is adjacent to the display area; a second display substrate facing the first display substrate, the second display substrate including an end portion corresponding to the non-display area of the first display substrate, the end portion extending along a first direction; a connection circuit board connected to the first display substrate at the non-display area thereof, the connection circuit board disposed adjacent to the end portion of the second display substrate; and a first spacer and a second spacer each on the end portion of the second display substrate, the first spacer and the second spacer spaced apart from each other along the first direction to define a space therebetween. Along a second direction which crosses the first direction, a central portion of the connection circuit board connected to the first display substrate faces the space between the first spacer and the second spacer on the second display substrate.

In an embodiment, the display device may further include a protection member on the non-display area of the first display substrate, the protection member disposed adjacent to the end portion of the second display substrate and covering a portion of the connection circuit board.

In an embodiment, the connection circuit board may include a first side surface closest to the end portion of the second display substrate, a second side surface which faces the first side surface along the second direction, and a third side surface and a fourth side surface which face each other along the first direction. The first display substrate may be connected to the connection circuit board at the first side surface thereof, and the protection member may overlap an entirety of a length of the first side surface of the connection circuit board.

In an embodiment, each of the third side surface and the fourth side surface may include a first portion connected on the first display substrate and a second portion which is bent from the first portion, and the first portion may include a first sub-portion contacting the protection member and a second sub-portion non-contacting the protection member.

In an embodiment, along the second direction, the third side surface and the fourth side surface may face the first spacer and the second spacer, respectively.

In an embodiment, a length of each of the first spacer and the second spacer may be inclined with respect to the first direction.

In an embodiment, the first spacer and the second spacer may be bilaterally symmetrical with respect to the space.

In an embodiment, along the second direction, the first spacer may overlap the second spacer.

In an embodiment, along the second direction, a first portion of the second spacer overlapping the first spacer may have a width less than that of a second portion of the second spacer non-overlapping the first spacer, and a first portion of the first spacer overlapping the second spacer may have a width less than that of a second portion of the first spacer non-overlapping the second spacer.

In an embodiment, the display device may further include a cover member connected to the first spacer and the second spacer to cover the connection circuit board.

In an embodiment, each of the first spacer and the second spacer may seal a gap between the second display substrate and the cover member.

In an embodiment, each of the first spacer and the second spacer may have a length extending along the first direction.

In an embodiment, the display device may further include a main circuit board connected to the connection circuit board, and the connection circuit board may have one end connected to the first display substrate and an opposing end connected to the main circuit board.

In an embodiment of the invention, a display device includes: a first display substrate including a display area and a non-display area which is adjacent to the display area; a second display substrate facing the first display substrate, the second display substrate including an end portion corresponding to the non-display area of the first display substrate, the end portion extending along a first direction; a plurality of connection circuit boards each connected to the first display substrate at the non-display area thereof and disposed adjacent to the end portion of the second display substrate; and a plurality of spacers each on the end portion of the second display substrate, the plurality of spacers spaced apart from each other along the first direction to respectively define spaces therebetween. Here, along a second direction which crosses the first direction, a central portion of a first connection circuit board among the plurality of connection circuit boards faces a respective space defined between two spacers adjacent to each other among the plurality of spacers.

In an embodiment of the invention, a display device includes: a first display substrate including a display area and a non-display area which is adjacent to the display area; a second display substrate facing the first display substrate, the second display substrate including an end portion corresponding to the non-display area of the first display substrate, the end portion extending along a first direction; a connection circuit board connected to the first display substrate at the non-display area thereof, the connection circuit board disposed adjacent to the end portion of the second display substrate; and a spacer on the end portion of the second display substrate, the spacer extending along the first direction and including a bottom surface facing the first display substrate, a top surface opposite to the bottom surface, and a plurality of side surfaces connecting the bottom surface and the top surface to each other. Here, a side surface among the side surfaces of the spacer is closest to the display area of the first display substrate along a second direction which crosses the first direction, and the side surface of the spacer defines a recess of the spacer which is recessed along the second direction toward the connection circuit board connected to the first display substrate.

In an embodiment, along the second direction, a central portion of the connection circuit board may face the recess of the spacer.

In an embodiment, the spacer may include an absorbent material in the recess.

In an embodiment, the display device may further include a protection member on the non-display area of the first display substrate, the protection member disposed adjacent to the end portion of the second display substrate and covering a portion of the connection circuit board.

In an embodiment, the display device may further include a cover member connected to the top surface of the spacer to cover the connection circuit board, and the spacer may seal a gap between the cover member and the second display substrate.

In an embodiment, a length of the spacer may be inclined with respect to the first direction.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

Figure 1A:
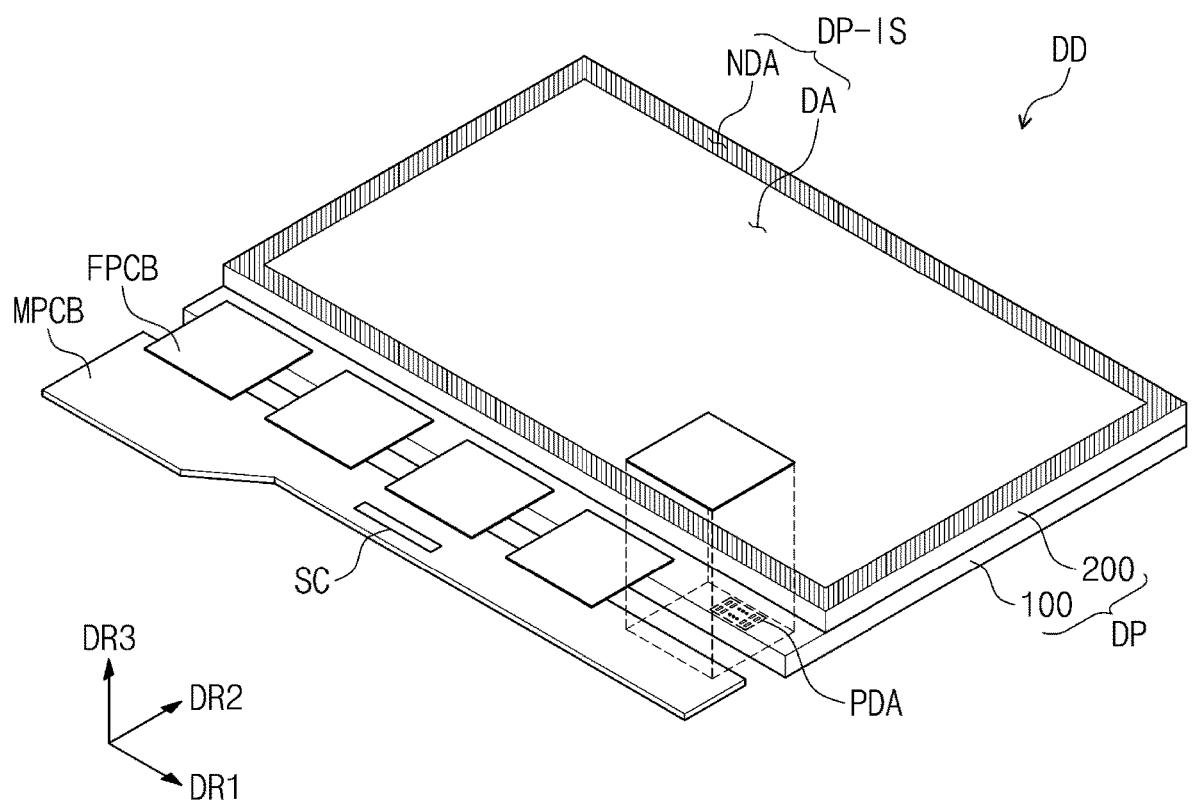
FIG. 1A is a perspective view illustrating an embodiment of a display device according to the invention.

It will be understood that when an element such as a region, layer, or portion is referred to as being related to another element such as being "on" another element, it can be directly on the other element or intervening elements may also be present. In contrast, when an element such as a region, layer, or portion is referred to as being related to another element such as being "directly on" another element, no other element or intervening elements are present.

Like reference numerals refer to like elements throughout. Also, in the figures, the thicknesses, ratios, and dimensions of components are exaggerated for clarity of illustration.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term and/or includes any and all combinations of one or more of the associated listed items.

It will be understood that although the terms of first and second are used herein to describe various elements, these elements should not be limited by these terms. The terms are only used to distinguish one component from other components. For example, a first element referred to as a first element in one embodiment can be referred to as a second element in another embodiment. The terms of a singular form may include plural forms unless referred to the contrary.

Also, spatially relative terms, such as "below," "lower," "above," and "upper," may be used herein for ease of description to describe an element and/or a feature's relationship to another element(s) and/or feature(s) as illustrated in the drawings. The terms are relative concepts and described with respect to the direction indicated in the drawings.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

The meaning of 'include' or 'comprise' specifies a property, a region, a fixed number, a step, a process, an element and/or a component but does not exclude other properties, regions, fixed numbers, steps, processes, elements and/or components.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A tape automated bonding ("TAB") mounting method may be used to bond a circuit board of a display device to a display panel thereof, such as by using an anisotropic conductive film ("ACF"). The circuit board may be connected to a lower portion of a display surface of the display panel, such as through the TAB mounting method. When moisture such as from spraying a material like a cleaning agent is incident to the display surface of the display panel on which an image is displayed, such moisture may undesirably be introduced into the circuit board that is connected to the display panel through the TAB mounting method. Thus, the circuit board may be damaged.

Hereinafter, embodiments of the invention will be described with reference to the accompanying drawings.

Figure 1B:
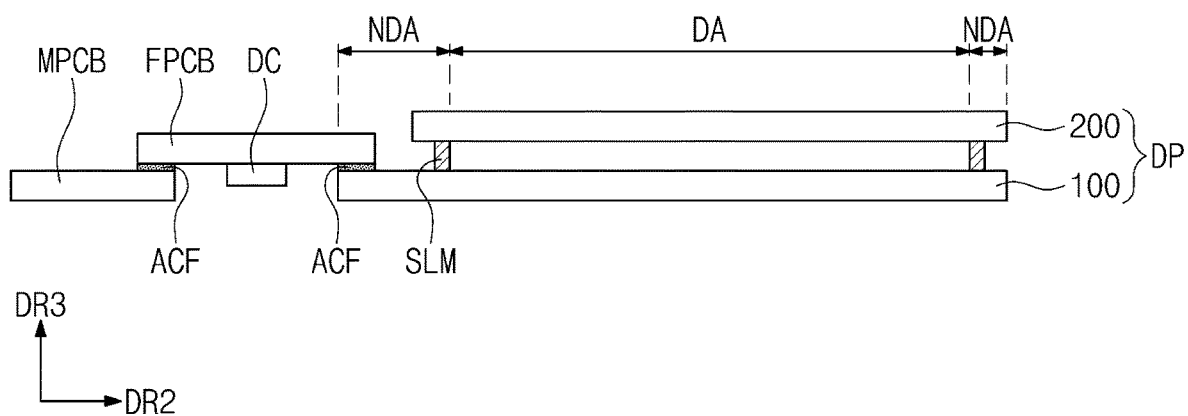
FIG. 1B is a cross-sectional view illustrating the display device of FIG. 1A according to the invention.
Figure 1C:
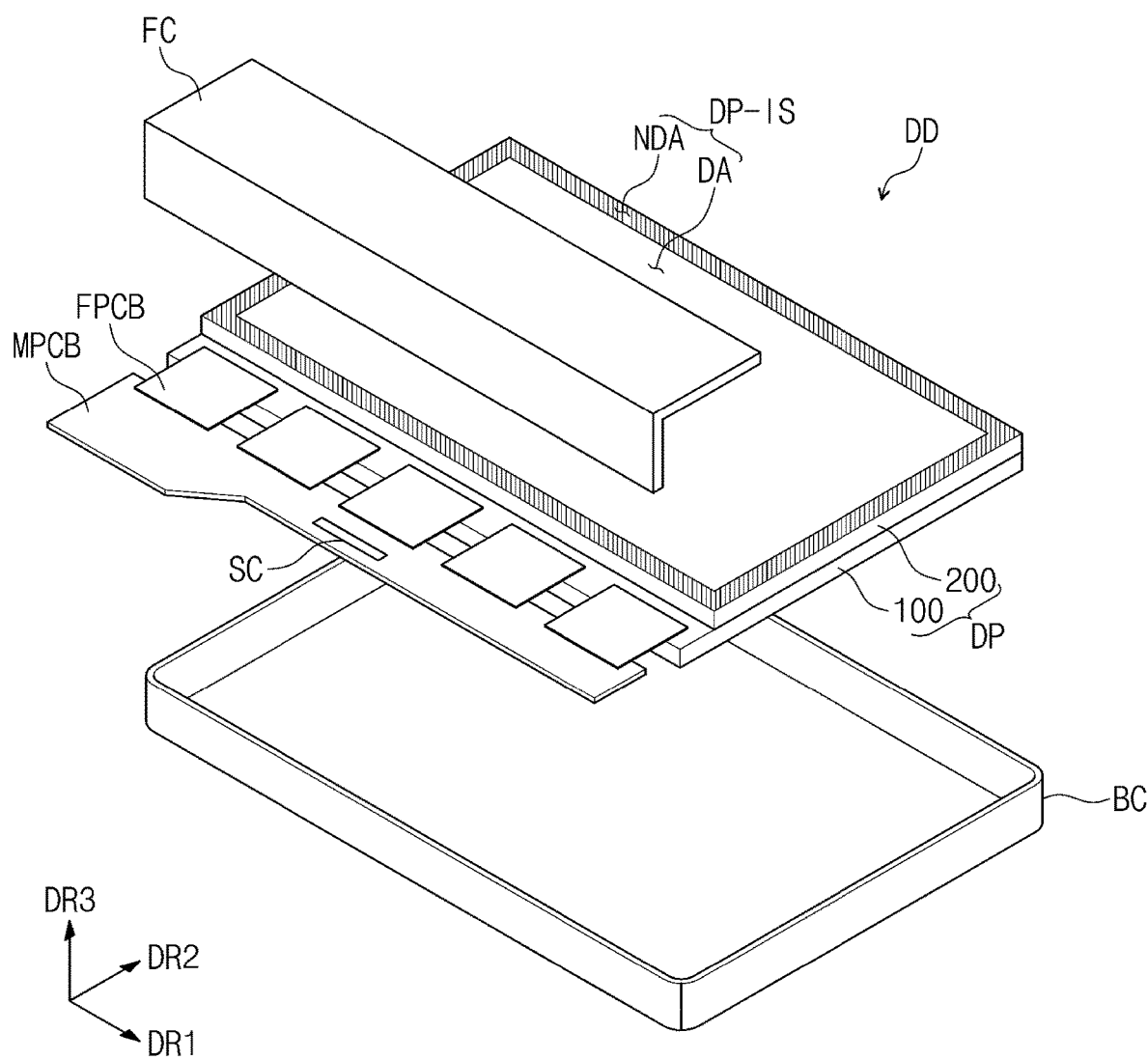
FIG. 1C is an exploded perspective view illustrating a modified embodiment of the display device of FIG. 1A according to the invention.

FIG. 1A is a perspective view of an embodiment of a display device according to the invention. FIG. 1B is a cross-sectional view illustrating the display device of FIG. 1A according to the invention. FIG. 1C is an exploded perspective view illustrating another embodiment of a display device according to the invention.

Referring to FIG. 1A, a display device DD includes a display panel DP, a connection circuit board FPCB, and a main circuit board MPCB. Although not shown, the display device DD may further include a chassis member or a molding member, and may further include a backlight unit according to a kind of the display panel DP.

The display panel DP may be one of a liquid crystal display panel, a plasma display panel, an electrophoretic display panel, a microelectromechanical system display panel, an electrowetting display panel, and an organic light emitting display panel. However, the invention is not limited thereto.

The display panel DP may include a first display substrate 100 and a second display substrate 200 which faces the first display substrate 100 while being spaced therefrom. A predetermined cell gap may be defined between the first display substrate 100 and the second display substrate 200. A display element layer may be disposed between the first display substrate 100 and the second display substrate 200. The display element layer may include a liquid crystal layer, an organic light emitting layer, and an electrophoretic layer according to kinds of display panel.

As illustrated in FIG. 1A, the display panel DP may display an image through a display surface DP-IS of the second display substrate 200. The display surface DP-IS is disposed in a plane which is parallel to a plane defined by a first direction DR1 and a second direction DR2. The display surface DP-IS may include a display area DA and a non-display area NDA. The non-display area NDA is defined along an edge of the display surface DP-IS. The display area DA may be surrounded by the non-display area NDA. In an embodiment of the invention, the non-display area NDA may be defined along only one edge of the display surface DP-IS, such as being disposed on only one side area of the display area DA which is adjacent to the connection circuit board FPCB. The first and second display substrates 100 and 200 may be disposed in different planes from each other, each generally defined by the first and second directions DR1 and DR2.

Also, although the non-display area NDA is defined through the display surface DP-IS of the second display substrate 200 in FIG. 1A, the non-display area NDA may include an area of the first substrate 100 which is exposed from the second display substrate 200, e.g., an area of the first display substrate 100 which does not overlap the second display substrate 200. In an embodiment, for example, as illustrated in FIG. 1B, the non-display area NDA may include an area of the first display substrate 100, to which the connection circuit board FPCB is attached.

A normal direction relative to the display surface DP-IS, e.g., a thickness direction of the display panel DP, indicates a third direction DR3. Hereinafter, a front surface (or top surface) and a rear surface (or bottom surface) of each of members or units are distinguished along the third direction DR3. However, the first to third directions DR1, DR2, and DR3 are intended to be illustrative in the embodiment. Hereinafter, first to third directions are indicated by the first to third directions DR1, DR2, and DR3, respectively, and referred to like reference numerals.

According to an embodiment of the invention, although the display panel DP is illustrated as having a flat display surface, the invention is not limited thereto. The display device DD may include a curved display surface or a three-dimensional display surface. The three-dimensional display surface may include a plurality of display areas respectively facing directions different from each other.

A signal control circuit SC may be mounted on the main circuit board MPCB. The signal control circuit SC receives image data and a control signal from an external graphic control unit (not shown) disposed external to the main circuit board MPCB. The signal control circuit SC may provide a control signal to the display panel DP with which elements within the display panel DP are controlled to generate and/or display an image.

The connection circuit board FPCB has a first end or side, which is electrically connected to a pad area PDA of the first display substrate 100, and a second end or side which is opposite to the first end, which is electrically connected to the main circuit board MPCB. As a result, the connection circuit board FPCB may transmit a signal outputted from the signal control circuit SC to the display panel DP. According to an embodiment of the invention, the connection circuit board FPCB may be provided as a flexible printed circuit board. The connection circuit board FPCB may be provided in plurality along a side of the display panel DP.

Referring to FIG. 1B, the display device DD may further include a driving chip DC disposed on the connection circuit board FPCB. The connection circuit board FPCB may receive the signal outputted from the signal control circuit SC of the main circuit board MPCB and transmit the received signal to the driving chip DC. The connection circuit board FPCB may transmit a signal outputted from the driving chip DC to the display panel DP. According to an embodiment of the invention, the driving chip DC may be a data driving circuit. Although the driving chip DC is described to be disposed on the connection circuit board FPCB, the invention is not limited thereto. In an embodiment, for example, the driving chip DC may be disposed on the first display substrate 100.

The connection circuit board FPCB may be connected to each of the display panel DP and the main circuit board MPCB by a conductive adhesion member. The conductive adhesion member may include an anisotropic conductive film ("ACF"). Hereinafter, the conductive adhesion member will be described as the anisotropic conductive film ("ACF").

The cell gap defined between the first display substrate 100 and the second display substrate 200 in FIG. 1A may be maintained by a sealant SLM.

Referring to FIG. 1C, the display device DD may further include a cover member FC and an accommodation member BC. The cover member FC may be disposed on the second display substrate 200 and extend therefrom along an end surface of the first display substrate 100 to cover the connection circuit board FPCB. The cover member FC may be disposed on the second display substrate 200 overlapping the non-display area NDA and extended from the second display substrate 200 to be coupled to the accommodation member BC.

According to an embodiment of the invention, the cover member FC may be disposed at one side of the second display substrate 200 which is adjacent to the connection circuit board FPCB. However, the invention is not limited thereto. In an embodiment, for example, the cover member FC may be disposed on the second display substrate 200 to overlap the entire non-display area NDA or may be omitted completely.

The accommodation member BC may accommodate overall components of the display device DD. In an embodiment, for example, the accommodation member BC may be coupled to the cover member FC and accommodate the display panel DP, the connection circuit board FPCB and the main circuit board MPCB.

Figure 2:
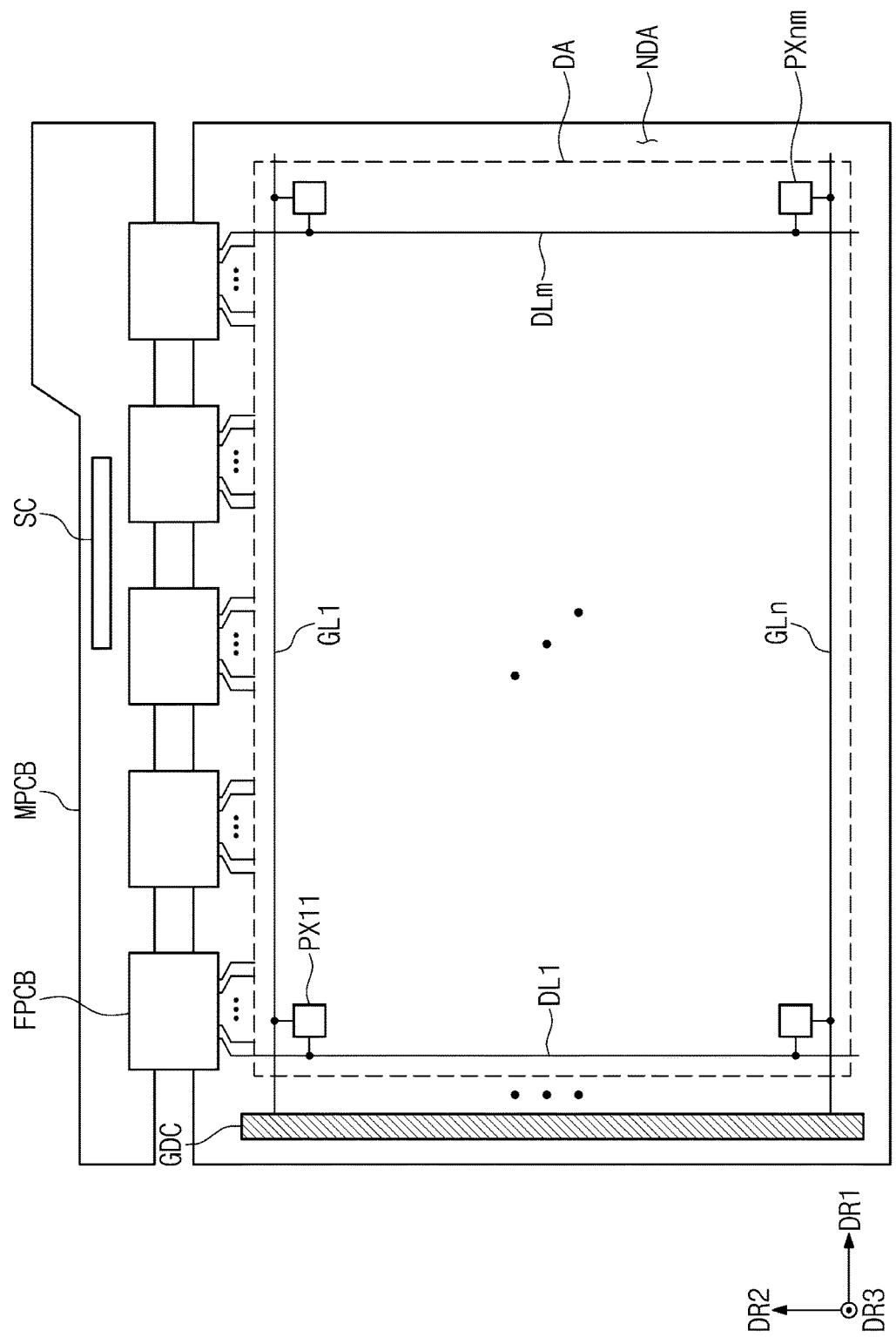
FIG. 2 is a top plan view illustrating the display device according to the invention.

FIG. 2 is an embodiment of a top plan view of a display device according to the invention.

Referring to FIG. 2, a planar arrangement relationship between signal lines GL1 to GLn and DL1 to DLm and pixels PX11 to PXnm is illustrated. The signal lines GL1 to GLn and DL1 to DLm may include a plurality of gate lines GL1 to GLn and a plurality of data lines DL1 to DLm.

The plurality of gate lines GL1 to GLn lengthwise extend in the first direction DR1 and are arranged in the second direction DR2. The plurality of data lines DL1 to DLm lengthwise extend in the second direction DR2 and are arranged in the first direction DR1. The plurality of data lines DL1 to DLm cross the plurality of gate lines GL1 to GLn in an insulating manner. The plurality of gate lines GL1 to GLn and the plurality of data lines DL1 to DLm overlap each of the display area DA and the non-display area NDA.

In an embodiment, each of the pixels PX11 to PXnm is connected to a corresponding gate line of the plurality of gate lines GL1 to GLn and a corresponding data line of the plurality of data lines DL1 to DLm. Each of the pixels PX11 to PXnm may include a pixel driving circuit and a display element which is controlled or driven by the pixel driving circuit. Although the pixels PX11 to PXnm arranged in a matrix form is exemplarily illustrated in FIG. 2, the invention is not limited thereto. In an embodiment, for example, the pixels PX11 to PXnm may be arranged in a PenTile matrix form. Alternatively, the pixels PX11 to PXnm may be arranged in a diamond shape form.

The gate driving circuit GDC may be integrated to the display panel DP through a oxide silicon gate driver circuit ("OSG") or amorphous silicon gate driver circuit ("ASG") process. The plurality of gate lines GL1 to GLn may be electrically connected to the gate driving unit GDC. The gate driving unit GDC may sequentially provide a plurality of gate signals to the plurality of gate lines GL1 to GLn, respectively.

The plurality of data lines DL1 to DLm may be connected to a corresponding connection circuit board among a plurality of connection circuit boards FPCB. In an embodiment, for example, although the display device DD in FIG. 2 includes five connection circuit boards FPCB, the invention is not limited thereto. According to another embodiment, the display device may include one single connection circuit board FPCB. That is, the plurality of data lines DL1 to DLm may be electrically connected to a same single one of the connection circuit board FPCB.

Figure 3:
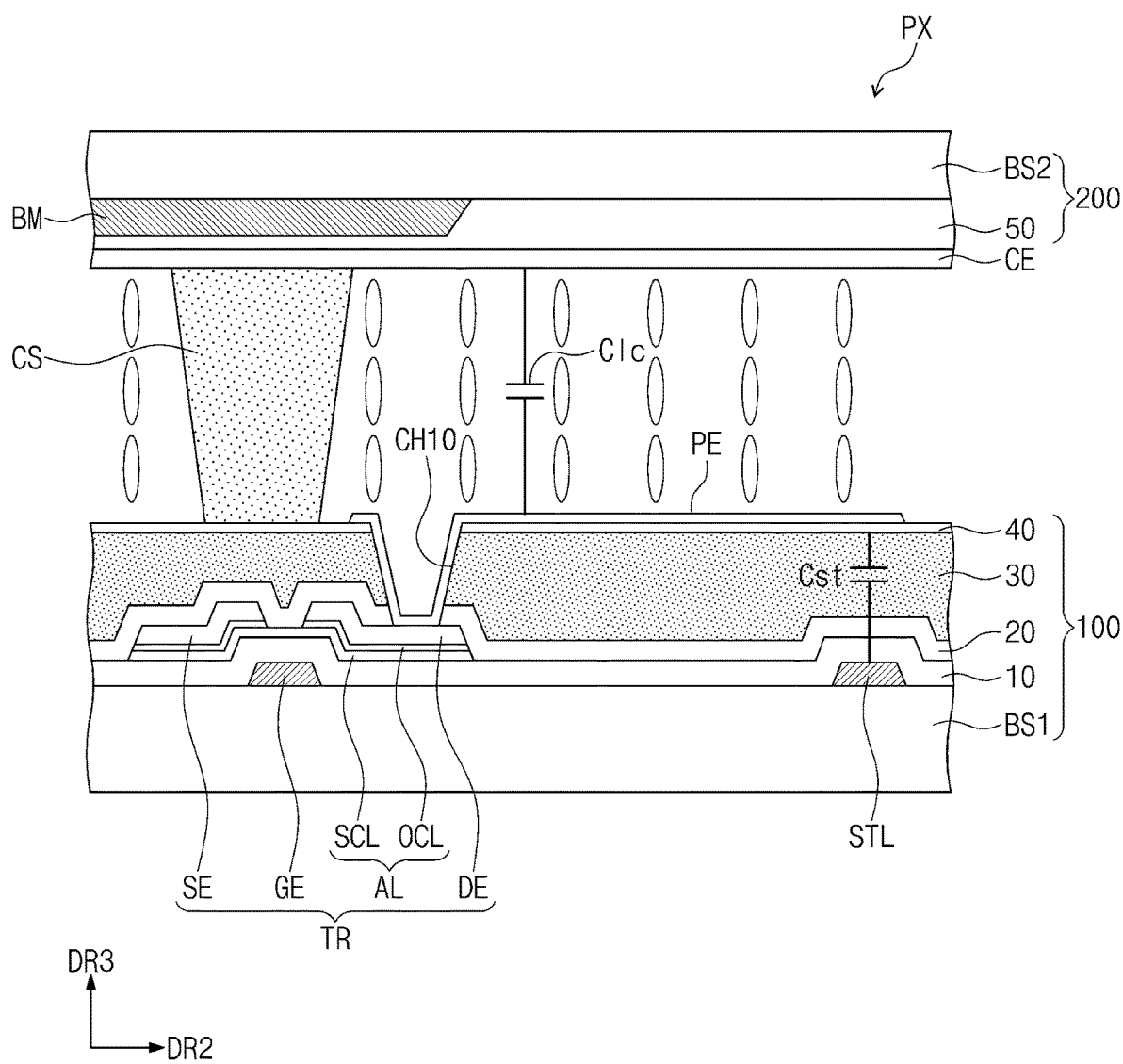
FIG. 3 is an enlarged cross-sectional view of an embodiment of a pixel in a display panel at a display area thereof according to the invention.
Figure 4:
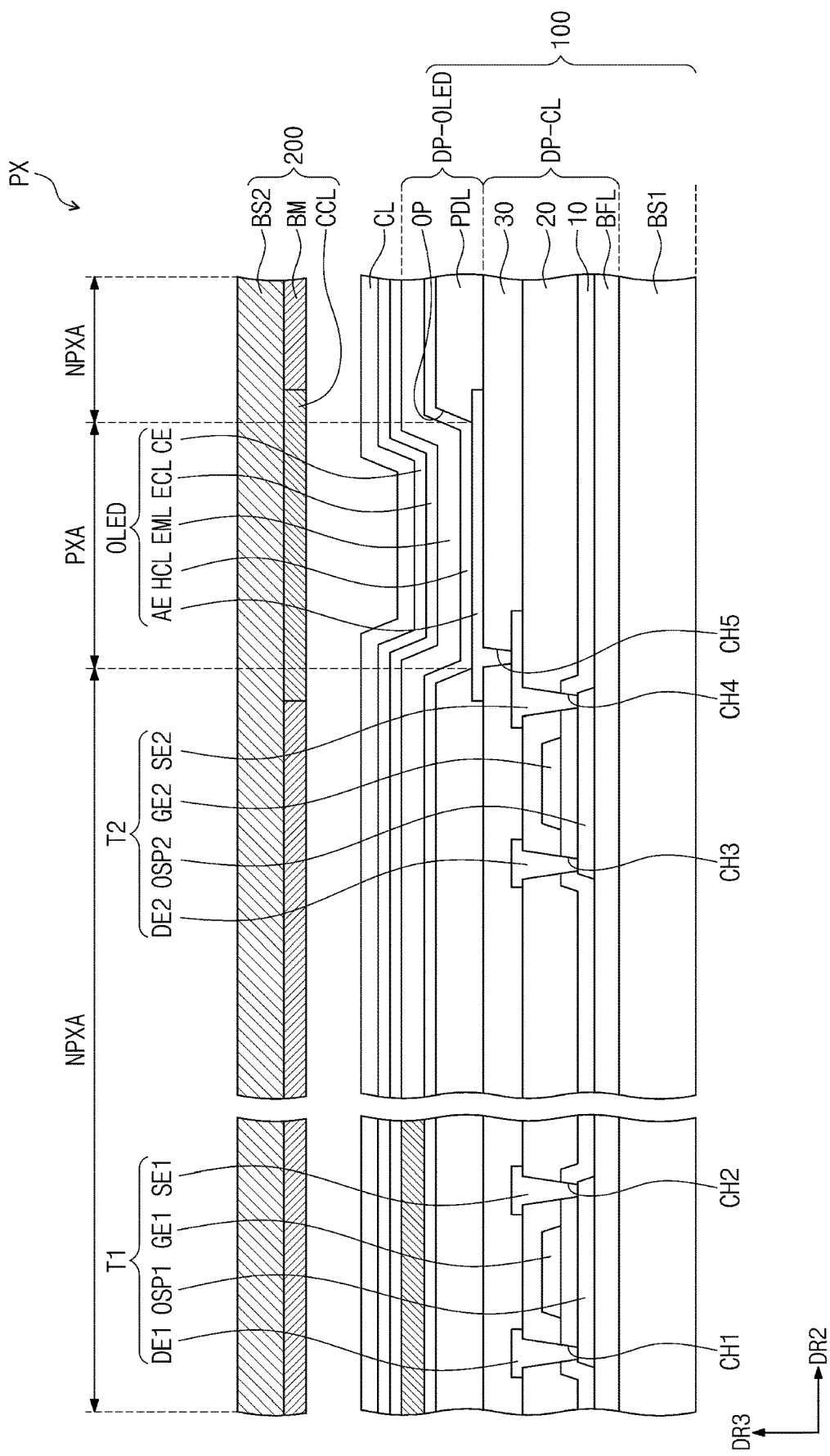
FIG. 4 is an enlarged cross-sectional view illustrating another embodiment of a pixel in a display panel at a display area thereof according to the invention.

FIG. 3 is an enlarged cross-sectional view illustrating an embodiment of a pixel in a display panel at a display area thereof according to the invention. FIG. 4 is an enlarged cross-sectional view illustrating another embodiment of a pixel in a display panel at a display area thereof according to the invention.

FIG. 3 illustrates a cross-section corresponding to a pixel PX of a liquid crystal display panel according to an embodiment of the invention, and FIG. 4 illustrates cross-section corresponding to a pixel PX of an organic light emitting display panel according to another embodiment of the invention. The respective display panels may have a display area and a non-display area which respectively correspond to those of the display device DD described above. The pixel PX illustrated in FIG. 3 or FIG. 4 may represent one or more of the pixels of the display device DD described above.

Referring to FIG. 3, the pixel PX of the liquid crystal display panel may include a transistor TR, a liquid crystal capacitor Clc, and a storage capacitor Cst.

The transistor TR includes a control electrode GE connected to a gate line, an activation part AL overlapping the control electrode GE, an input electrode SE connected to a data line, and an output electrode DE spaced apart from the input electrode SE. The liquid crystal capacitor Clc includes a pixel electrode PE and a common electrode CE. The storage capacitor Cst includes the pixel electrode PE and a portion of a storage line STL which overlaps the pixel electrode PE.

The control electrode GE and the storage line STL are disposed on one surface of a first base substrate BS1. The first base substrate BS1 may be a glass substrate or a plastic substrate. A first insulation layer 10, which covers the control electrode GE and the storage line STL, is disposed on the one surface of the first base substrate BS1. The first insulation layer 10 may include at least one of an inorganic material and an organic material. The activation part AL, which overlaps the control electrode GE, is disposed on the first insulation layer 10. The activation part AL may include a semiconductor layer SCL and an ohmic contact layer OCL. The semiconductor layer SCL is disposed on the first insulation layer 10, and the ohmic contact layer OCL is disposed on the semiconductor layer SCL.

The semiconductor layer SCL may include an amorphous silicon or poly-silicon. The semiconductor layer SCL may include a metal oxide semiconductor.

The ohmic contact layer OCL may include a dopant that is doped with a density relatively higher than the semiconductor layer. Portions of the ohmic contact layer OCL are illustrated in FIG. 3 as spaced apart from each other, but the invention is not limited thereto. In an embodiment of the invention, the ohmic contact layer OCL may have an integrated shape so as to not be disconnected at an area corresponding to the control electrode GE.

The output electrode DE and the input electrode SE are disposed on the activation part AL. The output electrode DE and the input electrode SE are spaced apart from each other. A second insulation layer 20, which covers the activation part AL, the output electrode DE, and the input electrode SE, is disposed on the first insulation layer 10. A third insulation layer 30 is disposed on the second insulation layer 20. Each of the second insulation layer 20 and the third insulation layer 30 may include at least one of an inorganic material and an organic material. The third insulation layer 30 is disposed on the second insulation layer 20. The third insulation layer 30 may be a single layered organic layer that provides a flat surface within the first display substrate 100.

According to an embodiment of the invention, the third insulation layer 30 may include a plurality of color filters. A fourth insulation layer 40 is disposed on the third insulation layer 30. The fourth insulation layer 40 may be an inorganic layer covering the color filters. Although the third insulation layer 30 includes the color filters, the invention is not limited thereto. In an embodiment, for example, the color filters may be disposed on the second display substrate 200.

As illustrated in FIG. 3, the pixel electrode PE is disposed on the fourth insulation layer 40. The pixel electrode PE is connected to the output electrode DE at or through a contact hole CH10 passing through the second insulation layer 20, the third insulation layer 30, and the fourth insulation layer 40. An orientation layer (not shown) covering the pixel electrode PE may be disposed on the fourth insulation layer 40.

A second base substrate BS2 may be a glass substrate or a plastic substrate. A black matrix layer BM is disposed on a bottom surface of the second base substrate BS2. That is, openings corresponding to pixel areas of the pixels may be defined in the black matrix layer BM. A pixel PX may include a pixel area at which light is emitted and/or an image is displayed, and a non-pixel area at which light is not emitted and/or an image is not displayed. A spacer CS may be disposed to overlap the black matrix layer BM.

An insulation layer covering the black matrix layer BM is disposed on the bottom surface of the second base substrate BS2. In an embodiment, for example, a fifth insulation layer 50, which provides a flat surface and includes an organic material, may be disposed on the second base substrate BS2.

The common electrode CE is disposed on the bottom surface of the second base substrate BS2. A common voltage is applied to the common electrode CE. The common voltage has a value different from a pixel voltage which may be applied to the pixel electrode PE.

The cross-section of the pixel PX is intended to be illustrative in FIG. 3. A position of the first display substrate 100 relative to a position of the second display substrate 200 may be reversed along the third direction DR3. In an embodiment, with the positions reversed to dispose the first display substrate 100 further along the third direction DR3 indicated in FIG. 3, the color filters may be disposed in the second display substrate 200.

According to an embodiment of the invention, although the liquid crystal display panel in a vertical alignment mode is exemplarily described, a liquid crystal display panel in an in-plane switching ("IPS") mode, a fringe-field switching ("FFS") mode, a plane to line switching ("PLS") mode, a super vertical alignment ("SVA") mode, or a surface-stabilized vertical alignment ("SS-VA") mode may be applied in one or more embodiments of the invention.

Referring to FIG. 4, the pixel PX of the organic light emitting display panel may include a switching transistor T1, a driving transistor T2, and a light emitting element OLED.

The organic light emitting display panel includes a display substrate 100 and an encapsulation substrate 200. The first display substrate 100 and the second display substrate 200 in FIG. 1A may correspond to the display substrate 100 and the encapsulation substrate 200, respectively.

The display substrate 100 includes a first base substrate BS1, a circuit element layer DP-CL disposed on the first base substrate BS1, a display element layer DP-OLED disposed on the circuit element layer DP-CL, and a cover layer CL disposed on the display element layer DP-OLED.

The encapsulation substrate 200 may include a second base substrate BS2, a black matrix layer BM disposed on the second base substrate BS2, and a color converting layer CCL.

The first base substrate BS1 may be a synthetic resin substrate or a glass substrate. The circuit element layer DP-CL includes at least one insulation layer and a circuit element. The circuit element includes a signal line, a driving circuit of a pixel, or the like. In an embodiment of manufacturing a display device, the circuit element layer DP-CL may be defined or formed through a process of forming an insulation layer, a semiconductor layer, and a conductive layer by coating or deposition and a process of patterning a material for forming the insulation layer, a material for forming the semiconductor layer, and a material for forming the conductive layer, such as by a photolithography process.

In the embodiment, the circuit element layer DP-CL may include a buffer layer BFL, a first insulation layer 10, a second insulation layer 20, and a third insulation layer 30. Each of the first insulation layer 10 and the second insulation layer 20 may be an inorganic layer, and the third insulation layer 30 may be an organic layer.

In FIG. 4, a respective arrangement relationship between a first semiconductor pattern OSP1, a second semiconductor pattern OSP2, a first control electrode GE1, a second control electrode GE2, a first input electrode DE1, a first output electrode SE1, a second input electrode DE2, and a second output electrode SE2 within the switching transistor T1 and the driving transistor T2 is exemplarily illustrated. First to fourth through-holes CH1, CH2, CH3, and CH4 relative to the switching transistor T1 and the driving transistor T2 are also exemplarily illustrated.

The display element layer DP-OLED includes the light emitting element OLED. The display element layer DP-OLED may include an organic light emitting diode as the light emitting element. The display element layer DP-OLED includes a pixel defining layer PDL. In an embodiment, for example, the pixel defining layer PDL may be an organic layer.

A first electrode AE is disposed on the third insulating layer 30 as an intermediate organic layer 30. The first electrode AE is connected to the second output electrode SE2 through a fifth contact hole CH5 passing through the intermediate organic layer 30. An opening OP is defined in the pixel defining layer PDL. The opening OP of the pixel defining layer PDL exposes at least a portion of the first electrode AE. The opening OP of the pixel defining layer PDL is a light emitting opening to be distinguished from other openings. That is, light is emitted at the opening OP of the pixel defining layer PDL.

As illustrated in FIG. 4, the display panel DP may include a light emitting area PXA and a non-light emitting area NPXA which is disposed adjacent to the light emitting area PXA. The non-light emitting area NPXA may surround the light emitting area PXA in the top plan view. In this embodiment, the light emitting area PXA is defined in correspondence to a partial area of the first electrode AE, which is exposed by the light emitting opening OP. The light emitting area PXA and the non-light emitting area NPXA may be generally considered as a "pixel area" and a "non-pixel area" described above, without being limited thereto.

A hole control layer HCL may be commonly disposed in the light emitting area PXA and the non-light emitting area NPXA. The hole control layer HCL may include a hole transporting layer and further include a hole injection layer. A light emitting layer EML is disposed on the hole control layer HCL. The light emitting layer EML may be commonly disposed in the light emitting area PXA and the non-light emitting area NPXA. In an embodiment of the invention, the light emitting layer EML may be disposed in the light emitting area PXA and may not be disposed in the non-light emitting area NPXA. The light emitting layer EML may include an organic material and/or an inorganic material. The light emitting layer EML may generate predetermined first color light, e.g., blue light. Such generated light may be emitted at the light emitting area PXA and may be used to display an image.

An electron control layer ECL is disposed on the light emitting layer EML. The electron control layer ECL may further include an electron transporting layer and further include an electron injection layer. The hole control layer HCL and the electron control layer ECL may be commonly provided to be disposed in each of a plurality of pixels, such as by using an open mask in a method of manufacturing a display device. A second electrode CE is disposed on the electron control layer ECL. The second electrode CE is commonly disposed in the plurality of pixels. The cover layer CL, which protects the second electrode CE, may be disposed on the second electrode CE. The cover layer CL may include an organic material or an inorganic material.

The second base substrate BS2 may be spaced apart from the cover layer CL. The second base substrate BS2 may include a synthetic resin substrate or a glass substrate. The color converting layer CCL may transmit first color light without color-conversion thereof or convert the first color light into second color light or third color light having a color different from that of the first color light, according to a function of the pixel PX. The color converting layer CCL may include a quantum dot.

In an embodiment of the invention, the encapsulation layer 200 may include a thin-film encapsulation layer. Here, the black matrix layer BM and the color converting layer CCL may be disposed on the thin-film encapsulation layer to form a collective encapsulation layer 200.

Figure 5:
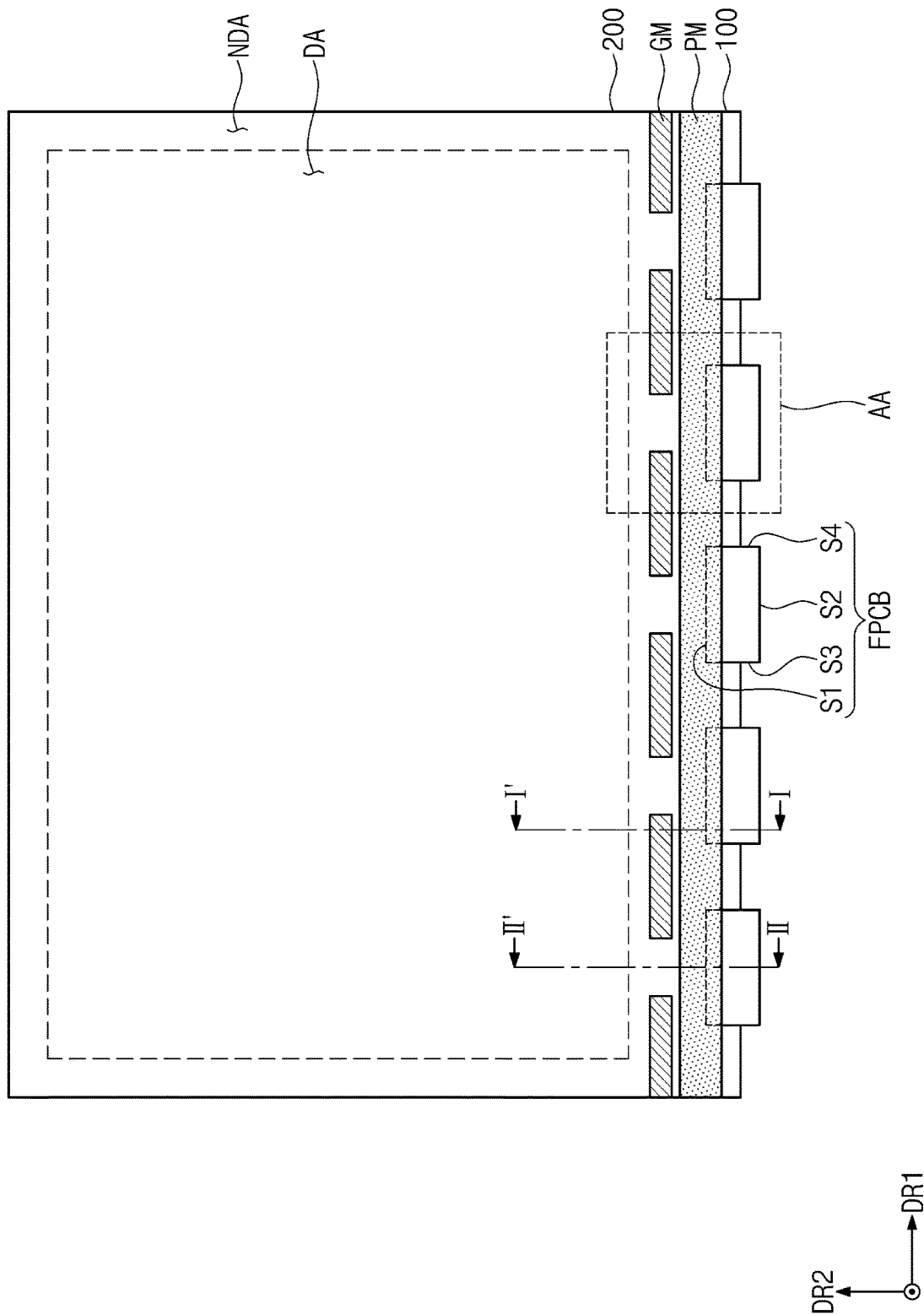
FIG. 5 is another embodiment of a top plan view of a display device according to the invention.
Figure 6:
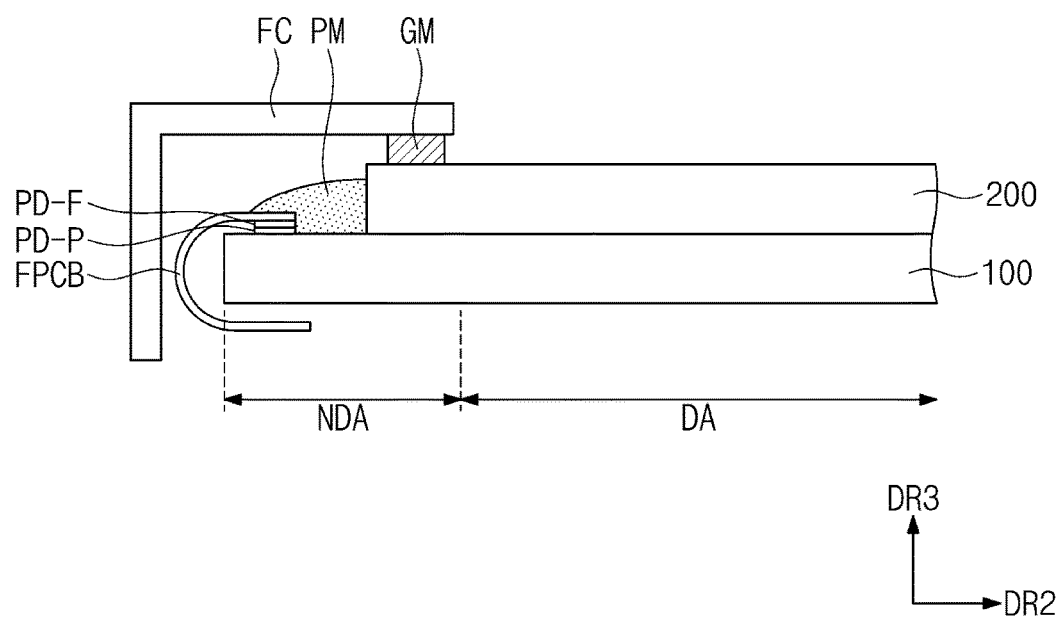
FIG. 6 is a cross-sectional view taken along line I-I' of FIG. 5.
Figure 7:
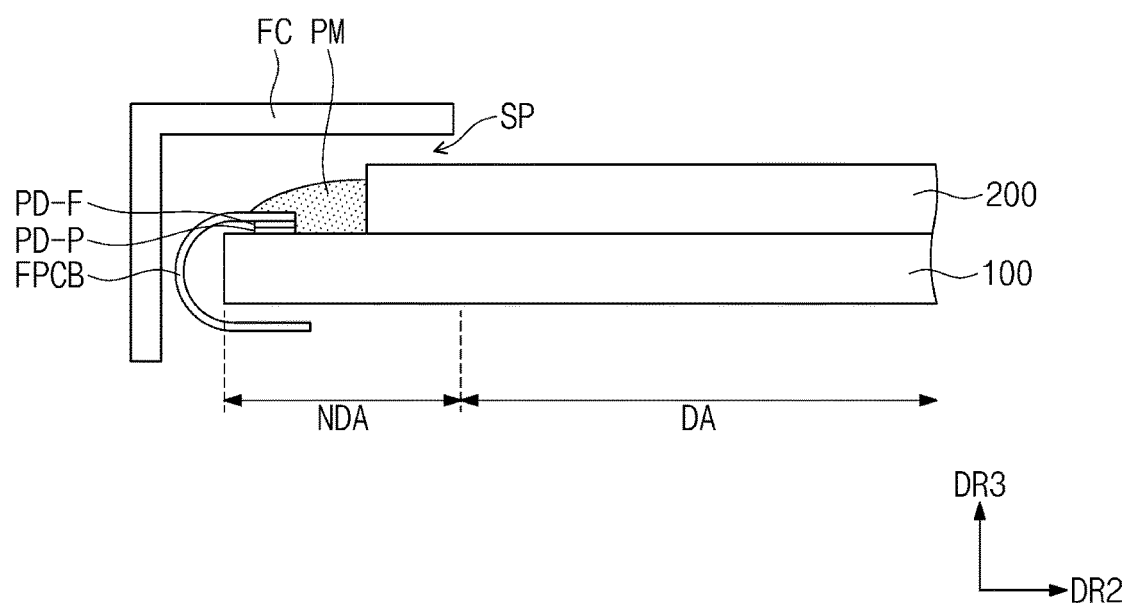
FIG. 7 is a cross-sectional view taken along line II-IF of FIG. 5.
Figure 8A:
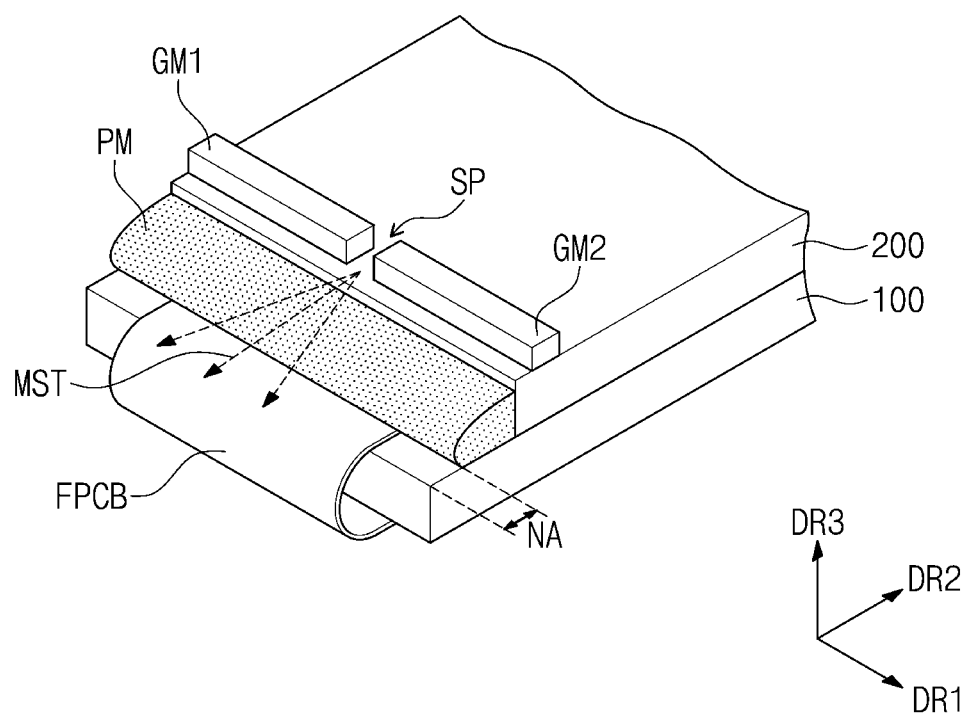
FIG. 8A is an enlarged perspective view of an embodiment of region AA of the display device of FIG. 5.
Figure 8B:
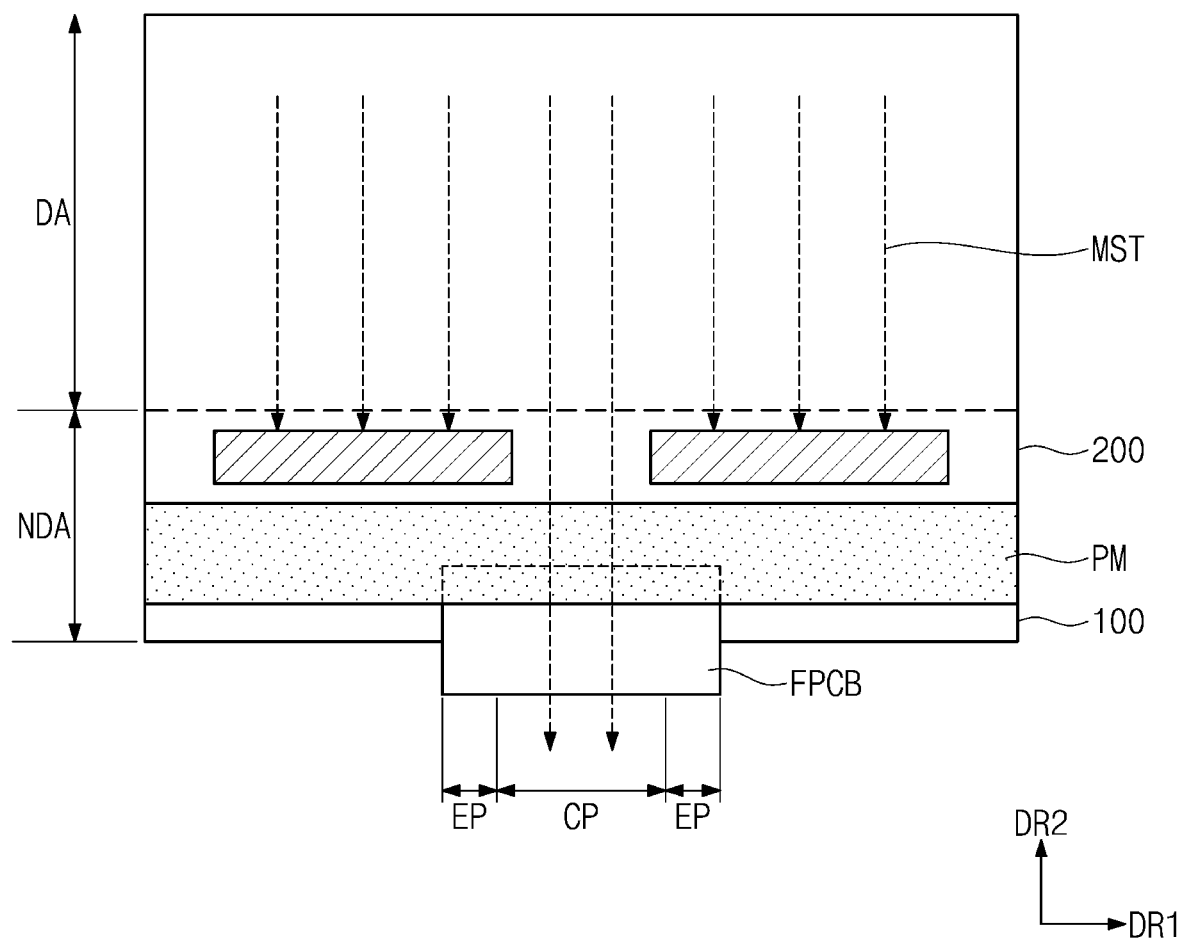
FIG. 8B is an enlarged top plan view of the region AA of the display device of FIG. 5.

FIG. 5 is another embodiment of a top plan view of a display device according to the invention. FIG. 6 is an enlarged cross-sectional view taken along line I-I' of FIG. 5. FIG. 7 is an enlarged cross-sectional view taken along line II-II' of FIG. 5. FIG. 8A is a perspective view illustrating an embodiment of region AA of the display device in FIG. 5. FIG. 8B is an enlarged top plan view of the region AA of the display device in FIG. 5.

According to an embodiment of the invention, the display device DD may display an image to the user through the display area DA of the display surface DP-IS in FIG. 1A. However, when foreign substances such as dust are disposed or dropped on the display area DA, visibility of the image may be degraded. Accordingly, an operation of removing the foreign substances such as by spraying moisture on the display surface DP-IS may be performed. In an embodiment, for example, the moisture may be a cleaning agent.

The moisture incident to the display surface DP-IS such as being sprayed thereon may be transferred along the second direction DR2. Hereinafter, the display surface DP-IS will be described as a surface of the second display substrate 200. In particular, the moisture sprayed on the surface of the second display substrate 200 may move from the surface of the second display substrate 200 to the surface of the first display substrate 100, at an area of the first display substrate 100 which extends along the second direction DR2 further than an edge of the second display substrate 200 to be exposed therefrom. That is, an area of the first display substrate 100 is disposed non-overlapping with the second display substrate 200.

According to an embodiment of the invention, the connection circuit board FPCB may have a first end connected to the first display substrate 100 at an area thereof non-overlapping the second display substrate 200. Accordingly, when the moisture transferred to the surface of the second display substrate 200 is introduced to the surface of the first display substrate 100 which non-overlaps the second display substrate 200, connection pads or terminals disposed on the connection circuit board FPCB and/or the first display substrate 100 may be damaged by the moisture.

According to an embodiment of the invention, the display device DD may further include a spacer GM provided in plurality and a protection member PM, which may reduce or effectively prevent damage to the circuit elements by the moisture transferred to the surface of first display substrate 100 from the second display substrate 200.

Referring to FIG. 5, each of the plurality of spacers GM may have a length extending in the first direction DR1, a width extending in the second direction DR2, and be disposed on the second display substrate 200. The plurality of spacers GM may be disposed on the non-display area NDA of the second display substrate 200, at a side thereof which is adjacent to the connection circuit board FPCB. The plurality of spacers GM may include or be made of a material into which the moisture may not be permeated. In an embodiment, for example, the spacers GM may include or be made of silicon, urethane (e.g., Poron®), rubber, or the like.

The protection member PM may have a length extending in the first direction DR1 and a width extending in the second direction DR2 while overlapping the non-display area NDA of the display device DD. According to an embodiment of the invention, the protection member PM may be disposed on the first display substrate 100 while covering a portion of each of the plurality of connection circuit boards FPCB connected to the first display substrate 100. The protection member PM may include or be made of an insulating material into which the moisture may not be permeated.

According to an embodiment of the invention, two spacers, which are adjacent to each other, of the plurality of spacers GM may face each other while being spaced apart from each other in the first direction DR1. In particular, in a plane which is parallel to that of the first display substrate 100, a space between the two adjacent spacers may face or correspond to a central portion of the connection circuit board FPCB in the second direction DR2.

The connection circuit board FPCB includes a first side surface S1 and a second side surface S2 which face each other along the second direction DR2, and a third side surface and a fourth side surface S4 which face each other along the first direction DR1.

According to an embodiment of the invention, the connection circuit board FPCB is connected to the first display substrate 100 at the first side surface S1, and to the main circuit board MPCB at the second side surface S2 (refer to FIG. 1A). In particular, a entirety of the first side surface S1 of the connection circuit board FPCB may overlap the first display substrate 100 and be connected to the first display substrate 100.

According to an embodiment of the invention, each of the third side surface and the fourth side surface S4 may include a first portion overlapping and/or connected on the first display substrate 100 and a second portion bent from the first portion to be disposed along a side surface of the first display substrate 100 along the third direction DR3. In a plane parallel to the plane of the first display substrate 100, the third side surface S3 and the fourth side surface S4 of the connection circuit board FPCB may face two spacers along the second direction DR2, where the two spacers are adjacent to each other along the first direction DR1. Also, the first portion of each of the third side surface S3 and the fourth side surface S4 which overlaps and/or is connected on the first display substrate 100, may include a first sub-portion contacting the protection member PM and a second sub-portion non-contacting the protection member PM.

In an embodiment, for example, a portion of the moisture which may be transferred along the surface of the second display substrate 200 may be transferred to the plurality of spacers GM in the second direction DR2. In this case, the moisture may not be transferred to the first display substrate 100 non-overlapping the second display substrate 200 by the plurality of spacers GM blocking or intercepting the moisture before transfer to the first display substrate 100.

As illustrated in FIG. 6, a gap may be defined between the cover member FC and the second display substrate 200 spaced apart from each other, and may be sealed by the spacer GM connected to the cover member FC. Accordingly, introduction of the moisture transferred along the second display substrate 200 in the second direction DR2 to the first display substrate 100 may be reduced or effectively prevented by the spacer GM.

In an embodiment, for example, another portion of the moisture which may be transferred along the surface of the second display substrate 200 may be introduced to the first display substrate 100 through the space between the two adjacent spacers GM among the plurality of spacers GM.

As illustrated in FIG. 7, at the gap between the cover member FC and the second display substrate 200, a space SP between two adjacent spacers may be further defined. When the moisture from between adjacent spacers GM on the second display substrate 200 is introduced to the side surface of the connection circuit board FPCB, the moisture may be transferred to the pad area PDA of the first display substrate 100 (refer to FIG. 1A) disposed corresponding to the connection circuit board FPCB. When the moisture is introduced to the pad area PDA of the first display substrate 100, pads PD-F and PD-P disposed on the pad area PDA may be damaged by the moisture. The pads may include circuit pads PD-F, which are electrically connected to each other and disposed on the connection circuit board FPCB, and a driving pad PD-P disposed on the first display substrate 100.

According to an embodiment of the invention, as illustrated in FIGS. 8A and 8B, the protection member PM may be disposed on a top surface of the first display substrate 100 and extend to a side surface of the second display substrate 200 at the end thereof, while covering a side surface of the connection circuit board FPCB. In an embodiment, the protection member PM may overlap an entirety of a length of the first side surface S1 of the connection circuit board FPCB. Moisture MST introduced through the space SP may be transferred to a top surface of the connection circuit board FPCB via the protection member PM. The top surface of the connection circuit board FPCB may include or be made of an insulating material into which the moisture MST is not permeated.

As described above, when the moisture MST introduced through the space SP is introduced through a side surface of the connection circuit board FPCB non-contacting the protection member PM, the pad may be damaged. That is, the moisture MST may be introduced through a side surface area NA at which a side surface of the connection circuit board FPCB is exposed as non-contacting the protection member PM, among the side surfaces of the connection circuit board FPCB connected on the first display substrate 100.

As illustrated in FIG. 8B, the connection circuit board FPCB includes a central portion CP and an edge portion EP at opposing sides of the central portion CP to be spaced apart from each other with the central portion CP therebetween along the first direction DR1. The central portion CP is disposed further from the side surface area NA of the connection circuit board FPCB than either of the edge portions EP. Along a plane which is parallel to the plane of the first display substrate 100, as the central portion CP of the connection circuit board FPCB faces the space SP in the second direction DR2, the moisture MST introduced to the protection member PM may be transferred to the central portion CP of the top surface of the connection circuit board FPCB which is spaced apart from the side surface area NA. That is, the central portion CP of the connection circuit board FPCB may be aligned with the space SP in the second direction DR2. As a result, introduction of the moisture MST introduced through the space SP to the side surface of the connection circuit board FPCB connected to the first display surface 100 may be more easily reduced or effectively prevented when the moisture is effectively guided to the central portion CP of the connection circuit board FPCB via the space SP.

As described above, when the moisture MST is transferred along the surface of the second display substrate 200, the moisture may be transferred to each of the plurality of spacers GM and the space SP.

Unlike the embodiment of the invention, one single spacer GM which omits the space SP between multiple spacers GM may be disposed on the second display substrate 200. In this case, as a relatively large amount of moisture is transferred along the surface of the second display substrate 200, the moisture may overflow the single spacer GM. However, according to one or more embodiments of the invention, as the moisture is introduced through the space SP between the multiple spacers GM spaced apart from each other, overflowing of the moisture at the multiple spacers GM may be reduced or effectively prevented.

Figure 9:
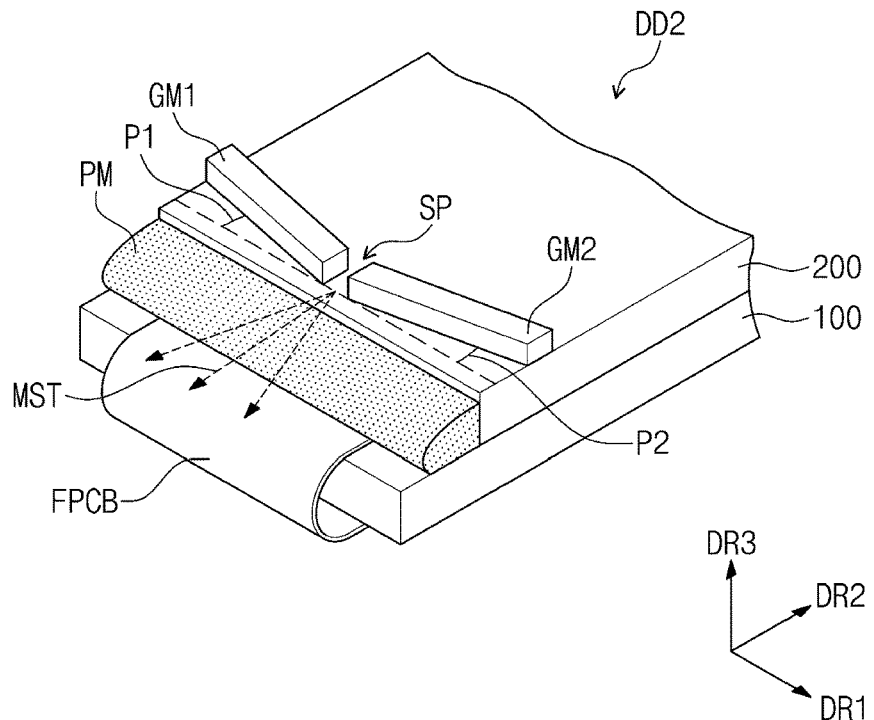
FIG. 9 is an enlarged perspective view illustrating another embodiment of the region AA of the display device of FIG. 5 according to the invention.

FIG. 9 is an enlarged perspective view illustrating another embodiment of the region AA of the display device of FIG. 5 according to the invention. Although a display device DD2 in FIG. 9 may have a modified structure of the spacers GM in comparison with the display device DD in FIG. 8A, other components of the display device DD2 may have substantially the same structure as those of the display device DD. Thus, description for the remaining components will be omitted.

Referring to FIG. 9, two spacers GM1 and GM2 of the plurality of spacers GM are exemplarily illustrated. The first spacer GM1 and the second spacer GM2 may be spaced apart from each other in the first direction DR1. A space SP may be defined by the first spacer GM1 and the second spacer GM2, which are spaced apart from each other in the first direction DR1.

According to an embodiment of the invention, each of the first spacer GM1 and the second spacer GM2 may each have a shape defined by a length which is inclined with respect to the first direction DR1 within the plane of the first display substrate 100 (e.g., plane defined by the first and second directions DR1 and DR2). In detail, the length of the first spacer GM1 may form a first angle P1 with the first direction DR1. The length of the second spacer GM2 may form a second angle P2 with the first direction DR1. In an embodiment, for example, the first angle P1 and the second angle P2 may be the same as each other. As a result, the first spacer GM1 and the second spacer GM2 may have a bilaterally symmetric shape with respect to the space SP. The first spacer GM1 and the second spacer GM2 may be inclined with respect to the end of the second display substrate 200 which is disposed at the protection member PM.

The moisture transferred along the surface of the second display substrate 200 may be transferred to the first spacer GM1 and the second spacer GM2. According to an embodiment of the invention, the moisture transferred to the first spacer GM1 and the second spacer GM2 may be introduced or guided into the space SP by the first spacer GM1 and the second spacer GM2, each of which is inclined from the first direction DR1.

Likewise, the moisture introduced into the space SP may be transferred to the central portion of the connection circuit board FPCB via the protection member PM. Within a plane parallel to the plane of the first display substrate 100, as the central portion CP of the connection circuit board FPCB faces the space SP along the second direction DR2, the moisture MST introduced to the protection member PM may be transferred to the central portion CP of the top surface of the connection circuit board FPCB. As a result, the moisture MST introduced through the space SP may not be introduced to the side surface of the connection circuit board FPCB connected on the first display surface 100.

Figure 10:
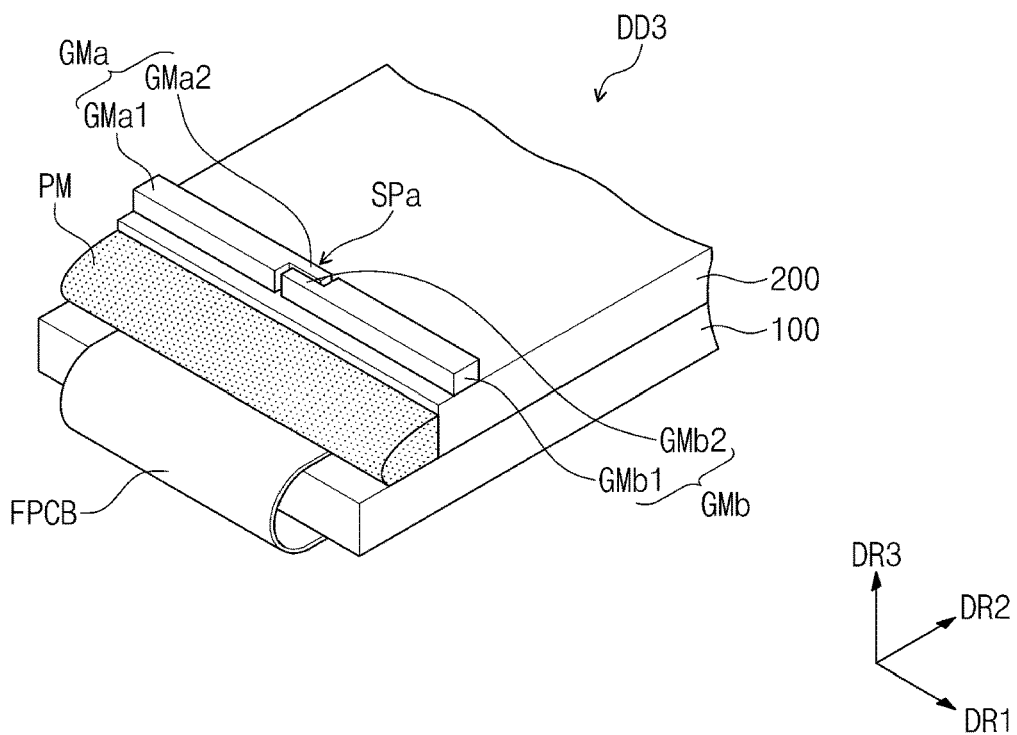
FIG. 10 is an enlarged perspective view illustrating still another embodiment of the region AA of the display device of FIG. 5 according to the invention.

FIG. 10 is an enlarged perspective view illustrating still another embodiment of region AA of the display device of FIG. 5 according to the invention. Although a display device DD3 in FIG. 10 may have a modified structure of the spacers GM in comparison with the display device DD in FIG. 8A, other components of the display device DD3 may have substantially the same structure as those of the display device DD. Thus, description for the remaining components will be omitted.

Referring to FIG. 10, two spacers GMa and GMb of the plurality of spacers GM are exemplarily illustrated. The first spacer GMa and the second spacer GMb may be spaced apart from each other in the first direction DR1. A space SPa may be defined by the first spacer GMa and the second spacer GMb, which are spaced apart from each other in the first direction DR1.

According to an embodiment of the invention, the first spacer GMa includes a first sub-spacer portion GMa1 and a second sub-spacer portion GMa2. The second spacer GMb includes a third sub-spacer portion GMb1 and a fourth sub-spacer portion GMb2.

According to an embodiment of the invention, along the second direction DR2, the first spacer GMa overlaps the second spacer GMb. In detail, the second sub-spacer portion GMa2 may lengthwise extend from the first sub-spacer portion GMa1 along the first direction DR1 and overlap the fourth sub-spacer portion GMb2 along the second direction DR2. Within a plane parallel to that of the second display substrate 200, the second sub-spacer portion GMa2 may have a planar area less than that of the first sub-spacer portion GM1*a*. Also, the second sub-spacer portion GMa2 overlapping the fourth sub-spacer portion GMb2 in the second direction DR2 may have a width along the second direction DR2 which is less than a width along the second direction DR2 of the first sub-spacer portion GMa1 non-overlapping the fourth sub-spacer portion GM2*b*.

Likewise, the fourth sub-spacer portion GMb2 may lengthwise extend from the third sub-spacer portion GMb1 along the first direction DR2 and overlap the second sub-spacer portion GMa2 along the second direction DR2. Within a plane parallel to the plane of the second display substrate 200, the fourth sub-spacer portion GMb2 may have a planar area less than that of the third sub-spacer portion GMb1. Also, the fourth sub-spacer portion GMb2 overlapping the second sub-spacer portion GMa2 along the second direction DR2 may have a width along the second direction DR2 which is less than a width along the second direction DR2 of the third sub-spacer portion GMb1 non-overlapping the second sub-spacer portion GMa2.

According to an embodiment of the invention, on a cross-section defined by the third direction DR3 and the first direction DR1, a space SPa between the first spacer GMa and the second spacer GMb may have a stair shape. At the space SPa, a flow path for moisture is defined along the plane defined by the first and second directions DR1 and DR2. A total length of the flow path within the plane defined by the first and second directions DR1 and DR2 is greater than a width of each of the first spacer GMa and the second spacer GMb along the second direction DR2. When the moisture transferred along the surface of the second display substrate 200 is introduced into the space SPa having a stair shape extending along the first and second directions DR1 and DR2, a relative speed of transferring the moisture through the space SPa and to the connection circuit board FPCB may be delayed. As a result, the moisture may be vaporized while the moisture is flowing through the space SPa and toward the connection circuit board FPCB.

Figure 11:
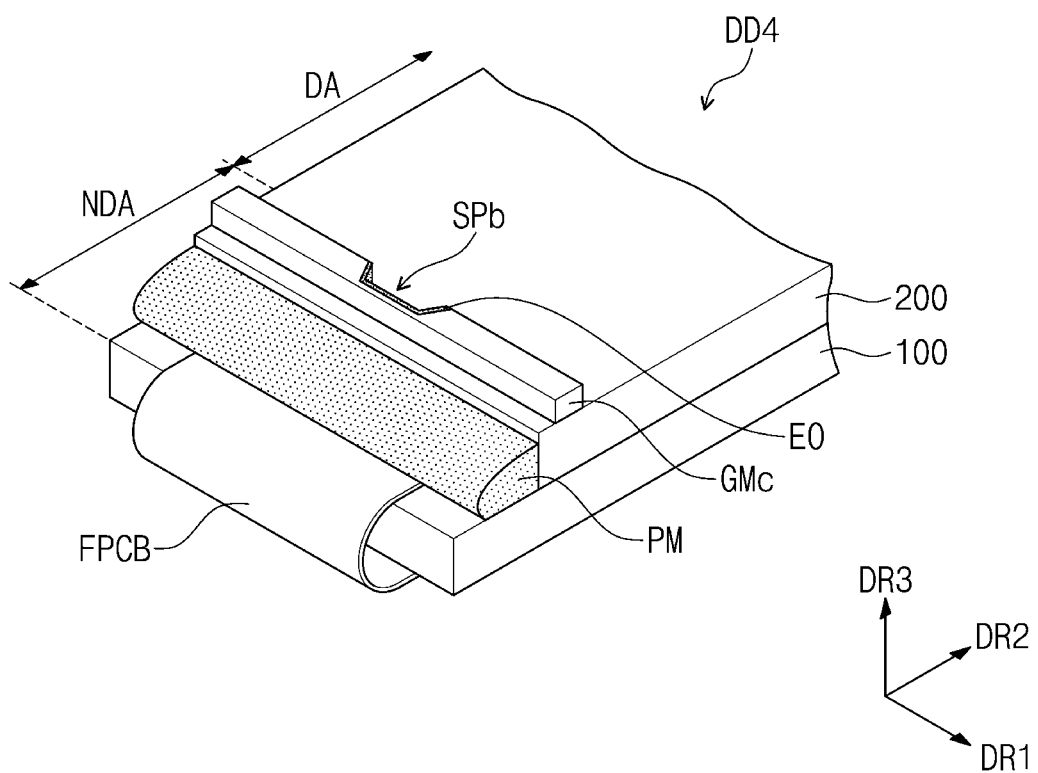
FIG. 11 is an enlarged perspective view illustrating yet another embodiment of the region AA of the display device of FIG. 5 according to the invention.

FIG. 11 is an enlarged perspective view illustrating yet another embodiment of the region AA of the display device of FIG. 5 according to the invention. Although a display device DD4 in FIG. 11 may have a modified structure of the spacers GM in comparison with the display device DD in FIG. 8A, other components of the display device DD4 may have substantially the same structure as those of the display device DD. Thus, description for the remaining components will be omitted.

Referring to FIG. 11, the display device DD4 may include a single spacer GMc. The spacer GMc may have a shape including a length extending along the first direction DR1. The spacer GMc includes a bottom surface disposed facing and on the second display substrate 200, a top surface opposite to the bottom surface, and side surfaces connecting the bottom surface to the top surface.

According to an embodiment of the invention, one side surface among the side surfaces of the spacer GMc, which is adjacent to the display area DA, may include a recessed space SPb, which is recessed along the second direction DR2. In particular, within a plane parallel to the plane of the second display substrate 200, the recessed space SPb may face the central portion CP of the connection circuit board FPCB along the second direction DR2. In an embodiment, the single spacer GMc may be disposed corresponding to each connection circuit board FPCB among a plurality of connection circuit boards FPCB arranged along the first direction DR1 at the end of the second display substrate 200 which is adjacent to the protective member PM. In an embodiment, the single spacer GMc may be disposed along substantially an entirety of the length of protective member PM at the end of the second display substrate 200, where the recessed space SPb is provided in plurality respectively corresponding to a plurality of connection circuit boards FPCB arranged along the first direction DR1 at the end of the second display substrate 200.

As described above, introduction of the moisture transferred along the surface of the second display substrate 200 to the first display substrate 100 may be reduced or effectively prevented by the spacer GMc and the recessed space SPb. In particular, even when a relatively large amount of moisture is transferred along the surface of the second display substrate 200, the moisture may be accumulated by the spacer GMc at the recessed space SPb defined therein.

Also, according to an embodiment of the invention, an absorbent layer EO may be disposed in the recessed space SPb. The absorbent layer EO may include or be made of a material which absorbs moisture incident thereto.

Although not shown, within a plane parallel to the plane of the second display substrate 200, the spacer GMc may have a shape including a length which is inclined with respect to the first direction DR1. That is, the spacer GMc may form a predetermined angle with the first direction DR1.

According to one or more embodiments of the invention, two spacers which face each other while being spaced apart from each other along one direction, may be disposed on the second display substrate overlapping the non-display area. In particular, as the central portion of the connection circuit board is aligned with the space between the two spacers, introduction of the moisture transferred along the surface of the second display substrate to the side surface of the connection circuit board may be reduced or effectively prevented.

As a result of minimizing or omitting moisture being introduced to the side surface of the connection circuit board, the overall driving reliability of the display device may be enhanced.

The invention has been particularly shown and described with reference to exemplary embodiments thereof. While specific terms were used, they were not used to limit the meaning or the scope of the invention described in claims, but merely used to explain the invention. Accordingly, a person having ordinary skill in the art will understand from the above that various modifications and other equivalent embodiments are also possible. Hence, the real protective scope of the invention shall be determined by the technical scope of the accompanying claims.

What is claimed is:

1. A display device comprising:
    a first display substrate comprising a display area and a non-display area which is adjacent to the display area;
    a second display substrate facing the first display substrate, the second display substrate comprising an end portion corresponding to the non-display area of the first display substrate, the end portion extending along a first direction;
    a connection circuit board connected to the first display substrate at the non-display area thereof, the connection circuit board disposed adjacent to the end portion of the second display substrate; and
    a first spacer and a second spacer each on the end portion of the second display substrate, the first spacer and the second spacer spaced apart from each other along the first direction to define a space therebetween,
    wherein along a second direction which crosses the first direction, a central portion of the connection circuit board connected to the first display substrate, faces the space between the first spacer and the second spacer on the second display substrate.

2. The display device of claim 1, further comprising a protection member on the non-display area of the first display substrate, the protection member disposed adjacent to the end portion of the second display substrate and covering a portion of the connection circuit board.

3. The display device of claim 2, wherein the connection circuit board connected to the first display substrate comprises:
    a first side surface closest to the end portion of the second display substrate,
    a second side surface which faces the first side surface along the second direction, and
    a third side surface and a fourth side surface which face each other along the first direction, and
    wherein
    the first display substrate is connected to the connection circuit board at the first side surface thereof, and
    the protection member overlaps an entirety of a length of the first side surface of the connection circuit board.

4. The display device of claim 3, wherein within the connection circuit board connected to the first display substrate,
    each of the third side surface and the fourth side surface comprises extended along the second direction:
        a first portion connected to the first display substrate, and
        a second portion which extends bent from the first portion, and
    the first portion comprises extended along the second direction:
        a first sub-portion contacting the protection member, and
        a second sub-portion non-contacting the protection member.

5. The display device of claim 3, wherein along the second direction, the third side surface and the fourth side surface of the connection circuit board connected to the first display substrate face the first spacer and the second spacer on the second display substrate, respectively.

6. The display device of claim 1, wherein a length of each of the first spacer and the second on the second display substrate is inclined with respect to the first direction.

7. The display device of claim 6, wherein the first spacer and the second spacer on the second display substrate are bilaterally symmetrical with respect to the space between the first spacer and the second spacer.

8. The display device of claim 1, wherein along the second direction, the first spacer overlaps the second spacer.

9. The display device of claim 8, wherein along the second direction,
    a first portion of the second spacer overlapping the first spacer has a width less than that of a second portion of the second spacer non-overlapping the first spacer, and
    a first portion of the first spacer overlapping the second spacer has a width less than that of a second portion of the first spacer non-overlapping the second spacer.

10. The display device of claim 1, further comprising a cover member connected to the first spacer and the second spacer on the second display substrate, the cover member extending from the second display substrate along an end surface of the first display substrate to cover the connection circuit board connected to the first display substrate.

11. The display device of claim 10, wherein
    the cover member is spaced apart from the end portion of the second display substrate to define a gap therebetween, and
    each of the first spacer and the second spacer connected to the cover member, seals the gap between the second display substrate and the cover member.

12. The display device of claim 1, wherein each of the first spacer and the second spacer on the second display substrate has a length extending along the first direction.

13. The display device of claim 1, further comprising a main circuit board connected to the connection circuit board connected to the first display substrate, wherein a first end of the connection circuit board is connected to the first display substrate and a second end of the connection circuit board which is opposite to the first end thereof is connected to the main circuit board.

14. A display device comprising:
a first display substrate comprising a display area and a non-display area which is adjacent to the display area;
a second display substrate facing the first display substrate, the second display substrate comprising an end portion corresponding to the non-display area of the first display substrate, the end portion extending along a first direction;
a plurality of connection circuit boards each connected to the first display substrate at the non-display area thereof and disposed adjacent to the end portion of the second display substrate; and
a plurality of spacers each on the end portion of the second display substrate, the plurality of spacers spaced apart from each other along the first direction to respectively define spaces therebetween,
wherein along a second direction which crosses the first direction, a central portion of a first connection circuit board among the plurality of connection circuit boards, faces a respective space defined between two spacers adjacent to each other among the plurality of spacers.

15. A display device comprising:
a first display substrate comprising a display area and a non-display area which is adjacent to the display area;
a second display substrate facing the first display substrate, the second display substrate comprising an end portion corresponding to the non-display area of the first display substrate, the end portion extending along a first direction;
a connection circuit board connected to the first display substrate at the non-display area thereof, the connection circuit board disposed adjacent to the end portion of the second display substrate; and
a spacer on the end portion of the second display substrate, the spacer extending along the first direction and comprising a bottom surface facing the first display substrate, a top surface opposite to the bottom surface, and a plurality of side surfaces connecting the bottom surface and the top surface to each other,
wherein
a side surface among the plurality of side surfaces of the spacer is closest to the display area of the first display substrate along a second direction which crosses the first direction, and
the side surface of the spacer defines a recess of the spacer which is recessed along the second direction toward the connection circuit board connected to the first display substrate.

16. The display device of claim 15, wherein along the second direction, a central portion of the connection circuit board connected to the first display substrate, faces the recess of the spacer on the second display substrate.

17. The display device of claim 15, wherein the spacer comprises an absorbent material in the recess.

18. The display device of claim 15, further comprising a protection member on the non-display area of the first display substrate, the protection member disposed adjacent to the end portion of the second display substrate and covering a portion of the connection circuit board.

19. The display device of claim 15, further comprising a cover member connected to the top surface of the spacer on the second display substrate, the cover member extending from the second display substrate along an end surface of the first display substrate to cover the connection circuit board connected to the first display substrate,
wherein
the cover member is spaced apart from the end portion of the second display substrate to define a gap therebetween, and
the spacer connected to the cover member, seals the gap between the cover member and the second display substrate.

20. The display device of claim 15, wherein a length of the spacer on the second display substrate is inclined with respect to the first direction.

* * * * *